US012610518B2

(12) United States Patent
Zeng

(10) Patent No.: US 12,610,518 B2
(45) Date of Patent: Apr. 21, 2026

(54) MANUFACTURING METHOD OF SEMICONDUCTOR STRUCTURE, SEMICONDUCTOR STRUCTURE, AND MEMORY

(71) Applicant: CHANGXIN MEMORY TECHNOLOGIES, INC., Hefei City (CN)

(72) Inventor: Yizhi Zeng, Hefei City (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 470 days.

(21) Appl. No.: 18/363,901

(22) Filed: Aug. 2, 2023

(65) Prior Publication Data

US 2023/0389270 A1 Nov. 30, 2023

Related U.S. Application Data

(63) Continuation of application No. PCT/CN2022/125746, filed on Oct. 17, 2022.

(30) Foreign Application Priority Data

Apr. 18, 2022 (CN) .......................... 202210404527.5

(51) Int. Cl.
*H10B 12/00* (2023.01)
(52) U.S. Cl.
CPC .................................... *H10B 12/05* (2023.02)
(58) Field of Classification Search
CPC ........ H10B 12/02; H10B 12/05; H10B 12/09; H10B 12/31; H10B 12/48; H10B 12/50
See application file for complete search history.

(56) References Cited

U.S. PATENT DOCUMENTS

| 8,653,622 | B2 | 2/2014 | Ahn et al. |
| 10,332,894 | B2 | 6/2019 | Jung et al. |
| 2021/0391532 | A1* | 12/2021 | Yin ........................ H10N 50/10 |

FOREIGN PATENT DOCUMENTS

| CN | 108400130 A | 8/2018 |
| CN | 113517231 A | 10/2021 |
| CN | 114758990 A | 7/2022 |

OTHER PUBLICATIONS

International Search Report cited in PCT/CN2022/125746 mailed Jan. 18, 2023, 9 pages.

* cited by examiner

*Primary Examiner* — Britt Hanley
*Assistant Examiner* — Kevin Quinto
(74) *Attorney, Agent, or Firm* — SYNCODA LLC; Feng Ma

(57) ABSTRACT

The present application provides a manufacturing method of a semiconductor structure, a semiconductor structure, and a memory. The manufacturing method of a semiconductor structure includes: providing a substrate, where the substrate includes an array region, a core region, and a boundary region located between the array region and the core region; forming a first isolation layer, where the first isolation layer is located in the array region and a second-part boundary region adjacent to the array region; and forming a first conductive layer, where the first conductive layer is located in the core region and a first-part boundary region adjacent to the core region. The first conductive layer is planarized to obtain a flat top surface.

17 Claims, 9 Drawing Sheets

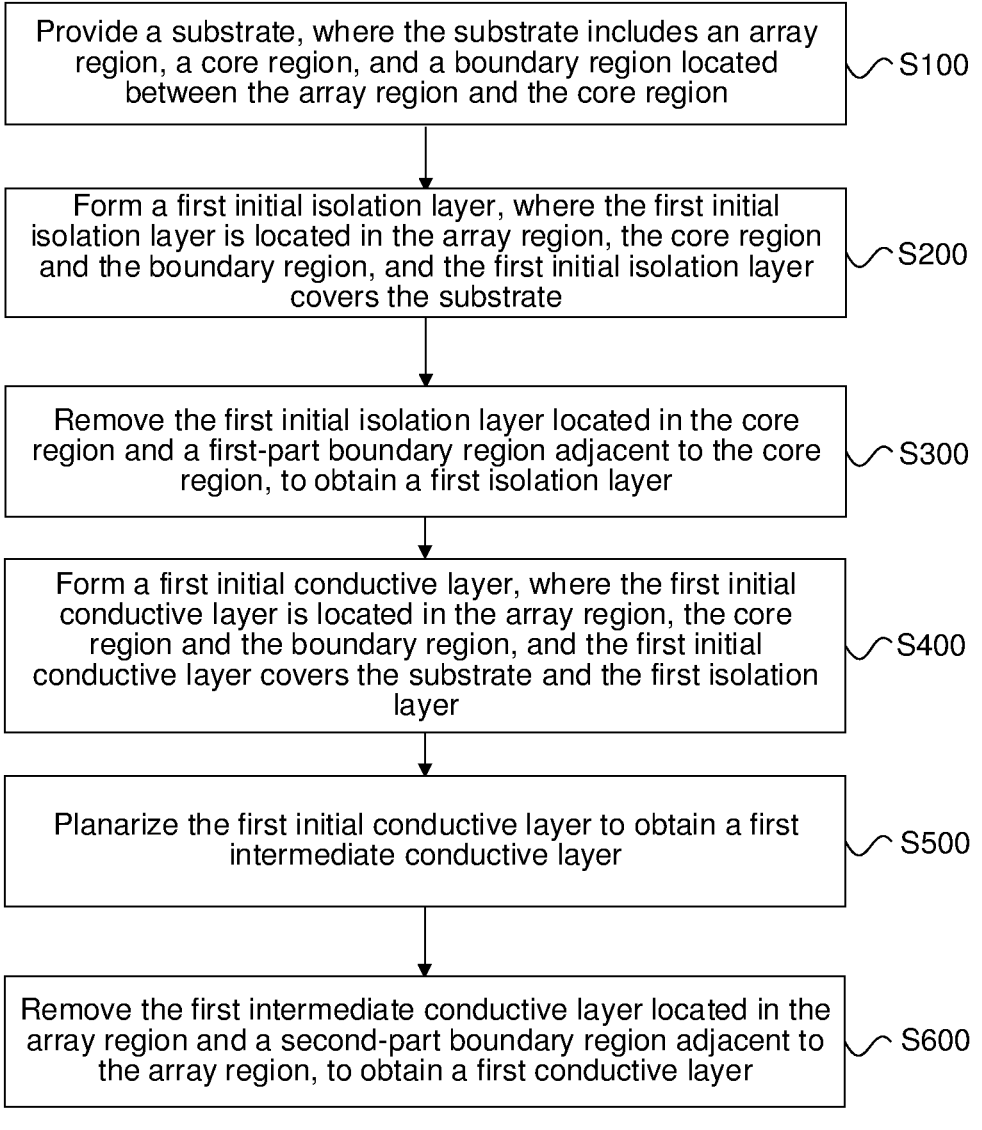

| | |
|---|---|
| Provide a substrate, where the substrate includes an array region, a core region, and a boundary region located between the array region and the core region | S100 |
| Form a first initial isolation layer, where the first initial isolation layer is located in the array region, the core region and the boundary region, and the first initial isolation layer covers the substrate | S200 |
| Remove the first initial isolation layer located in the core region and a first-part boundary region adjacent to the core region, to obtain a first isolation layer | S300 |
| Form a first initial conductive layer, where the first initial conductive layer is located in the array region, the core region and the boundary region, and the first initial conductive layer covers the substrate and the first isolation layer | S400 |
| Planarize the first initial conductive layer to obtain a first intermediate conductive layer | S500 |
| Remove the first intermediate conductive layer located in the array region and a second-part boundary region adjacent to the array region, to obtain a first conductive layer | S600 |

FIG. 2

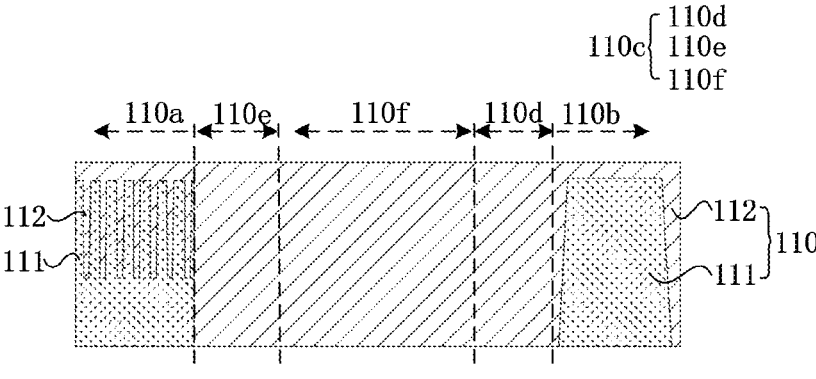

FIG. 3

MANUFACTURING METHOD OF SEMICONDUCTOR STRUCTURE, SEMICONDUCTOR STRUCTURE, AND MEMORY

CROSS-REFERENCE TO RELATED APPLICATIONS

This is a continuation of International Patent Application No. PCT/CN2022/125746, filed on Oct. 17, 2022, which claims priority to Chinese Patent Application No. 202210404527.5, titled "MANUFACTURING METHOD OF SEMICONDUCTOR STRUCTURE, SEMICONDUC-TOR STRUCTURE, AND MEMORY" and filed on Apr. 18, 2022. The disclosures of International Patent Application No. PCT/CN2022/125746 and Chinese Patent Application No. 202210404527.5 are incorporated herein by reference in their entireties.

TECHNICAL FIELD

The present application relates to the technical field of semiconductors, and in particular, to a manufacturing method of a semiconductor structure, a semiconductor structure, and a memory.

BACKGROUND

The dynamic random access memory (DRAM) is a semiconductor memory that randomly writes and reads data at a high speed, and is widely used in data storage devices or apparatuses.

In the related art, the DRAM includes a substrate, and the substrate includes an array region and a peripheral region provided outside the array region. When the DRAM is manufactured, an isolation layer is usually formed on the substrate, the isolation layer extends from the array region to the peripheral region, and a conductive layer is formed on the isolation layer.

However, in the manufacturing process of the DRAM above, the surface flatness of the conductive layer is poor, thus affecting the structure and performance of the DRAM.

SUMMARY

Embodiments of the present disclosure provide a manufacturing method of a semiconductor structure, a semiconductor structure, and a memory, which can improve the surface flatness of the conductive layer, thereby avoiding the influence on the structure and performance of the semiconductor structure and the memory.

The embodiments of the present disclosure provide the following technical solutions:

A first aspect of the embodiments of the present disclosure provides a manufacturing method of a semiconductor structure, including: providing a substrate, where the substrate includes an array region, a core region, and a boundary region located between the array region and the core region; forming a first initial isolation layer, where the first initial isolation layer is located in the array region, the boundary region and the core region, and the first initial isolation layer covers the substrate; removing the first initial isolation layer located in the core region and a first-part boundary region adjacent to the core region, to obtain a first isolation layer; forming a first initial conductive layer, where the first initial conductive layer is located in the array region, the boundary region and the core region, and the first initial conductive layer covers the substrate and the first isolation layer; planarizing the first initial conductive layer to obtain a first intermediate conductive layer; and removing the first inter-mediate conductive layer located in the array region and a second-part boundary region adjacent to the array region, to obtain a first conductive layer, where an orthographic pro-jection of the first conductive layer on the substrate partially overlaps with an orthographic projection of the first isolation layer on the substrate, and an overlap part between the orthographic projection of the first conductive layer on the substrate and the orthographic projection of the first isola-tion layer on the substrate is located in the boundary region.

A second aspect of the embodiments of the present disclosure provides a semiconductor structure, manufac-tured by the manufacturing method of a semiconductor structure according to the first aspect.

A third aspect of the embodiments of the present disclo-sure provides a memory, including the semiconductor struc-ture manufactured by the manufacturing method of a semi-conductor structure according to the first aspect.

The structure and other objectives and beneficial effects of the present disclosure will be described in detail with reference to the drawings to make the preferred embodi-ments more obvious and understandable.

BRIEF DESCRIPTION OF THE DRAWINGS

To describe the technical solutions in the embodiments of the present disclosure or in the prior art more clearly, the following briefly describes the accompanying drawings required for describing the embodiments or the prior art. Apparently, the accompanying drawings in the following description show some embodiments of the present disclo-sure, and a person of ordinary skill in the art may still derive other drawings from these accompanying drawings without creative efforts.

FIG. 2 is a schematic flowchart of a manufacturing method of a semiconductor structure according to an embodiment of the present disclosure;

FIG. 3 is a schematic structural diagram of providing a substrate according to an embodiment of the present disclo-sure;

REFERENCE NUMERALS

100—Semiconductor structure; 110—Substrate;
110*a*—Array region; 110*b*—Core region;
110*c*—Boundary region; 110*d*—First-part boundary region;
110*e*—Second-part boundary region; 110*f*—Third-part boundary region;
111—Active region; 112—Isolation structure;
121—First initial isolation layer; 122—First isolation layer;
131—First initial conductive layer; 132—First intermediate conductive layer;
133—First conductive layer; 134—Step portion;
135—Doping material; 141—Second initial mask layer;
142—Second mask layer; 151—Second conductive layer;
152—Third conductive layer; and 153—Second isolation layer.

DETAILED DESCRIPTION

Figure 1:
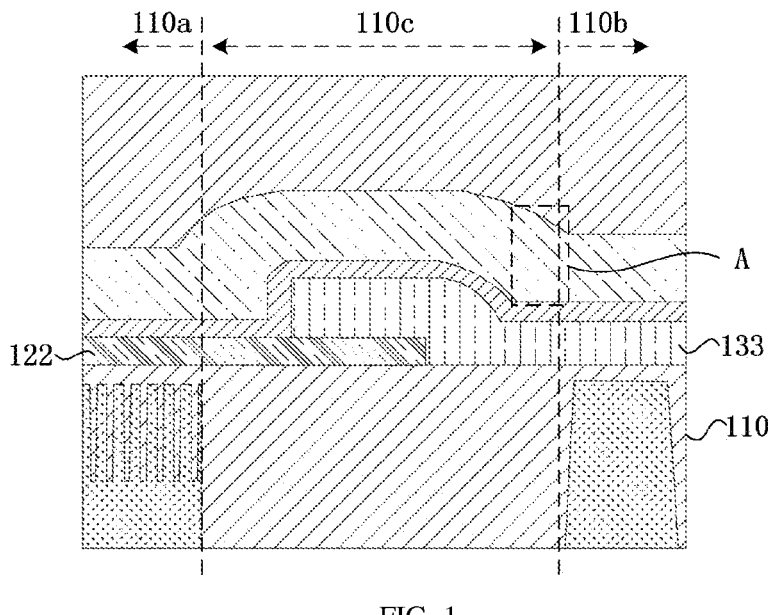
FIG. 1 is a schematic structural diagram of a semicon-ductor structure.

In the related art, the DRAM includes a plurality of repeated memory cells. Each memory cell includes a capacitor and a transistor. A gate of the transistor is connected to a word line (WL), one of a drain and a source of the transistor is connected to a bit line, and the other one of the drain and the source of the transistor is connected to the capacitor. A voltage signal on the WL can control turn-on or turn-off of the transistor, and then data information stored in the capacitor is read by the bit line, or the data information is written into the capacitor by the bit line for storage. The WL is connected to a WL driver through a contact structure (local interconnect contact, called LICON for short) located at the periphery of the memory cell. In this way, it is convenient for the WL driver to input the voltage signal into the WL. As shown in FIG. 1, the DRAM may include a substrate 110. The substrate 110 includes an array region 110*a*, a boundary region 110*c*, and a core region 110*b*. The boundary region 110*c* is located between the array region 110*a* and the core region 110*b*. When the DRAM is manufactured, a first isolation layer 122 is formed on a substrate firstly, and the first isolation layer 122 is located in the array region 110*a* and part of the boundary region 110*c* close to the array region 110*a*, to expose the substrate 110 in the remaining region. Then, a first conductive layer 133 is provided on the first isolation layer 122 in part of the boundary region 110*c* and on the exposed substrate 110.

However, in the manufacturing process of the DRAM above, the first isolation layer 122 covers the array region 110*a* and part of the boundary region 110*c* close to the array region 110*a*, and part of the boundary region 110*c* close to the core region 110*b* and the core region 110*b* do not cover the first isolation layer 122. Therefore, there are steps between the region covered with the first isolation layer 122 and the region not covered with the first isolation layer 122, such that the steps are formed on the first conductive layer 133 in the boundary region 110*c* and other functional layers covering the first conductive layer 133, and the first conductive layer 133 and the functional layers on the first conductive layer 133 have poor surface flatness. Taking the functional layer at part A in FIG. 1 as an example, in the actual process, the functional layer (i.e., part A in FIG. 1) located at the steps is thicker than the remaining region of the functional layer; and compared with the remaining region of the functional layer, it is not easy to completely etch the functional layer at part A, and it is easy to generate residues for the functional layer at part A, thereby affecting the structure and performance of the DRAM.

Although the remaining part of the functional layer can be completely removed by means of over-etching treatment, this is likely to cause damage to other structural layers in the remaining region where the functional layer is not left, thereby affecting the structure and performance of the DRAM.

The embodiments of the present disclosure provide a manufacturing method of a semiconductor structure, a semiconductor structure, and a memory. The manufacturing method of a semiconductor structure may include: providing a substrate, where the substrate includes an array region, a core region, and a boundary region located between the array region and the core region; forming a first initial isolation layer, where the first initial isolation layer is located in the array region, the boundary region and the core region, and the first initial isolation layer covers the substrate; removing the first initial isolation layer located in the core region and a first-part boundary region adjacent to the core region, to obtain a first isolation layer; forming a first initial conductive layer, where the first initial conductive layer is located in the array region, the boundary region and the core region, and the first initial conductive layer covers the substrate and the first isolation layer; planarizing the first initial conductive layer to obtain a first intermediate conductive layer; and removing the first intermediate conductive layer located in the array region and a second-part boundary region adjacent to the array region, to obtain a first conductive layer, where an orthographic projection of the first conductive layer on the substrate partially overlaps with an orthographic projection of the first isolation layer on the substrate, and an overlap part between the orthographic projection of the first conductive layer on the substrate and the orthographic projection of the first isolation layer on the substrate is located in the boundary region. The first initial conductive layer is planarized, such that the formed first conductive layer has good surface flatness, other functional layers manufactured above the first conductive layer have good flatness, and the functional layer located above the first conductive layer has an uniform thickness, thereby avoiding or reducing residues of the functional layers in the etching process, and avoiding or reducing the influence on the structure and performance of the semiconductor structure and the memory.

In order to make the objectives, technical solutions and advantages of the embodiments of the present disclosure clearer, the technical solutions in the embodiments of the present disclosure are clearly and completely described below with reference to the accompanying drawings in the embodiments of the present disclosure. Apparently, the described embodiments are some rather than all of the embodiments of the present disclosure. All other embodiments obtained by those of ordinary skill in the art based on the embodiments of the present disclosure without creative efforts should fall within the protection scope of the present disclosure.

The manufacturing method of a semiconductor structure 100 provided in the embodiments of the present disclosure is described below with reference to FIG. 1 to FIG. 18.

As shown in FIG. 2, the manufacturing method of a semiconductor structure 100 may include the following steps:

S100: provide a substrate, where the substrate includes an array region, a core region, and a boundary region located between the array region and the core region.

As shown in FIG. 3, the substrate 110 is provided firstly. The substrate 110 may include an array region 110a, a boundary region 110c, and a core region 110b, which are adjacently arranged in sequence. The boundary region 110c is located between the array region 110a and the core region 110b. For example, the boundary region 110c and the core region 110b may be located on at least one side of the array region 110a. For example, the boundary region 110c may be disposed at the periphery of the array region 110a. That is, the boundary region 110c may surround the array region 110a. In addition, the core region 110b may be disposed at the periphery of the boundary region 110c. That is, the core region 110b may surround the boundary region 110c.

A capacitor may be subsequently formed above the array region 110a of the substrate 110. A peripheral circuit may be subsequently formed above the core region 110b of the substrate 110. For example, the peripheral circuit may include a transistor, etc. The boundary region 110c is a transition region located between the array region 110a and the core region 110b.

For example, as shown in FIG. 3, the boundary region 110c includes a first-part boundary region 110d, a second-part boundary region 110e, and a third-part boundary region 110f located between the first-part boundary region 110d and the second-part boundary region 110e. The first-part boundary region 110d is part of the boundary region 110c close to the core region 110b, and the first-part boundary region 110d is adjacent to the core region 110b. The second-part boundary region 110e is part of the boundary region 110c close to the array region 110a, and the second-part boundary region 110e is adjacent to the array region 110a. The third-part boundary region 110f is part of the boundary region 110c located between the first-part boundary region 110d and the second-part boundary region 110e.

Still referring to FIG. 3, an active region 111 may be provided in the substrate 110, part of the active region 111 may be located in the array region 110a and configured to form a transistor, and the active region 111 located in the array region 110a may be arranged in an array. Part of the active region 111 may be located in the core region 110b and configured to form the transistor. For example, the spacing between the active regions 111 located in the array region 110a is small, and the spacing between the active regions 111 located in the core region 110b is large. An isolation structure 112 is provided between the active regions 111 to separate the active regions 111. For example, the material of the isolation structure 112 may be an oxide, such as silicon oxide.

For example, the substrate 110 may include a substrate and an oxide layer located on the substrate. The active region 111 and the isolation structure 112 may both be located in the substrate. The oxide layer on the substrate may avoid exposure of the active region 111. The oxide layer located in the array region 110a may be thicker than that located in the core region 110b. A thick oxide layer may be formed on the substrate firstly. The thick oxide layer located in the core region 110b is removed, and the thick oxide layer located in the array region 110a is retained. In addition, the thick oxide layer in part or whole of the boundary region 110c may further be removed, or the thick oxide layer in the boundary region 110c is retained. Next, a thin oxide layer is formed on the substrate in the core region 110b. The thin oxide layer may be a high-quality oxide layer, to improve the performance of a device (such as a transistor) having the thin oxide layer.

For example, the thin oxide layer may have a high dielectric constant to achieve good insulativity, thereby improving a breakdown voltage of a transistor including the thin oxide layer. Materials having a high dielectric constant may include any one or more of tantalum oxide ($Ta_2O_5$), aluminum oxide ($Al_2O_3$), hafnium oxide (HfO), titanium silicon oxide ($SiTiO_3$), hafnium silicon oxide (HfSiO), hafnium silicon oxynitride (HfSiON), and zirconium silicon oxynitride (ZrSiON).

For example, the material of the substrate may be monocrystalline silicon, polycrystalline silicon, amorphous silicon, germanium silicide, silicon carbide, gallium nitride, etc. The substrate may be a bulk silicon substrate, or may also be a silicon on insulator (SOI) substrate. The substrate may provide a support basis for other structure layers thereon.

S200: form a first initial isolation layer, where the first initial isolation layer is located in the array region, the boundary region and the core region, and the first initial isolation layer covers the substrate.

Figure 4:
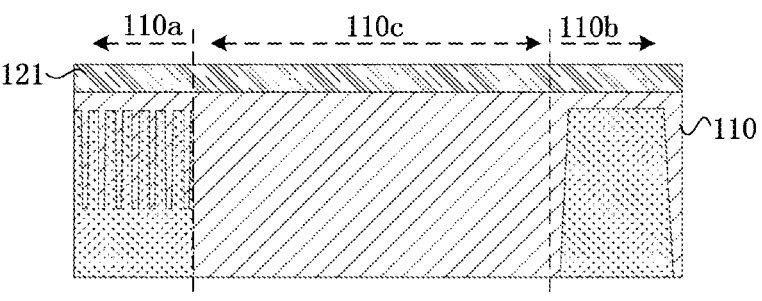
FIG. 4 is a schematic structural diagram of forming a first initial isolation layer according to an embodiment of the present disclosure.

As shown in FIG. 4, a first initial isolation layer 121 is formed on the substrate 110, and the first initial isolation layer 121 covers the array region 110a, the boundary region 110c and the core region 110b of the substrate 110. For example, the material of the first initial isolation layer 121 may be silicon nitride, which has a good isolation effect.

The first initial isolation layer 121 may be formed on the substrate 110 by means of a deposition process. For example, the first initial isolation layer 121 may be formed on the substrate 110 by means of a process such as chemical vapor deposition (CVD), physical vapor deposition (PVD), or atomic layer deposition (ALD).

S300: remove the first initial isolation layer located in the core region and a first-part boundary region adjacent to the core region, to obtain a first isolation layer.

Figure 5:
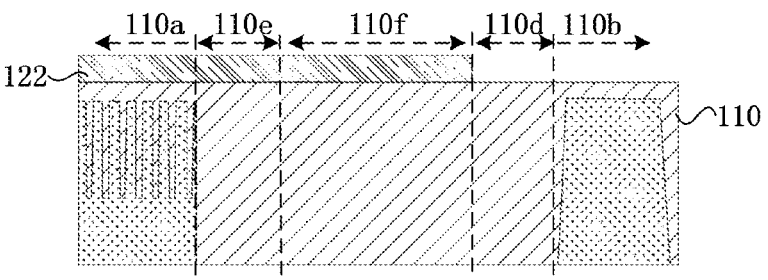
FIG. 5 is schematic structural diagram of forming a first isolation layer according to an embodiment of the present disclosure.

As shown in FIG. 5, part of the first initial isolation layer 121 is removed to form the first isolation layer 122, and the first isolation layer 122 is configured to isolate the substrate 110 located below the first isolation layer 122 from other structural layers located above the first isolation layer 122.

For example, the first initial isolation layer 121 located in the boundary region 110c and the core region 110b may be removed, and the first initial isolation layer 121 located in the array region 110a may be retained, to form the first isolation layer 122 on the substrate 110 in the array region 110a.

For example, as shown in FIG. 5, the first initial isolation layer 121 located in the core region 110b and the first-part boundary region 110d may be removed, and the first initial isolation layer 121 located in the array region 110a, the second-part boundary region 110e and the third-part boundary region 110f may be retained, to form the first isolation layer 122 on the substrate 110 in the array region 110a, the second-part boundary region 110e and the third-part boundary region 110f. For example, the orthographic projection of the array region 110a on the substrate 110 is located within the orthographic projection of the first isolation layer 122 on the substrate 110, such that the first isolation layer 122 completely covers the array region 110a, thereby achieving a good isolation effect on the substrate 110 in the array region 110a.

For example, S300 may include:

form an initial mask layer on the first initial isolation layer 121, where the initial mask layer may be a first initial mask layer covering the array region 110a, the boundary region 110c and the core region 110b of the substrate 110. The material of the first initial mask layer may be photoresist.

The first initial mask layer in the core region 110b and the first-part boundary region 110d is removed to form a first mask layer; the first mask layer covers the first initial isolation layer 121 in the array region 110a, the second-part boundary region 110e and the third-part boundary region 110f; and the first initial isolation layer 121 in the core region 110b and the first-part boundary region 110d is exposed.

The first initial isolation layer 121 in an uncovered region of the first mask layer, namely the core region 110b and the first-part boundary region 110d is removed by taking the first mask layer as a mask, to form the first isolation layer 122. The first isolation layer 122 is located on the substrate 110 in the array region 110a, the second-part boundary region 110e and the third-part boundary region 110f.

The first mask layer is removed to expose the first isolation layer 122.

It should be noted that in some examples, before the first initial isolation layer 121 is formed, the thick oxide layer located in the array region 110a and the thin oxide layer located in the core region 110b may be respectively formed, and the first initial isolation layer 121 covers the thick oxide layer and the thin oxide layer. In some other examples, before the first initial isolation layer 121 is formed, the thick oxide layer may be formed firstly, the thick oxide layer covers the substrate in the array region 110a, the boundary region 110c and the core region 110b, and the first initial isolation layer 121 covers the thick oxide layer. Then, while the first initial isolation layer 121 in the core region 110b and the first-part boundary region 110d is removed, the thick oxide layer in the core region 110b and the first-part boundary region 110d is removed. In this way, there is no need to remove the thick oxide layer and the first initial isolation layer 121 in stages, and the manufacturing process can be simplified. After that, the thin oxide layer is formed on the substrate in the core region 110b and the first-part boundary region 110d, and part of the thin oxide layer can cover the edge of the first isolation layer 122, thereby avoiding exposure of the substrate and protecting the substrate.

S400: form a first initial conductive layer, where the first initial conductive layer is located in the array region, the boundary region and the core region, and the first initial conductive layer covers the substrate and the first isolation layer.

Figure 6:
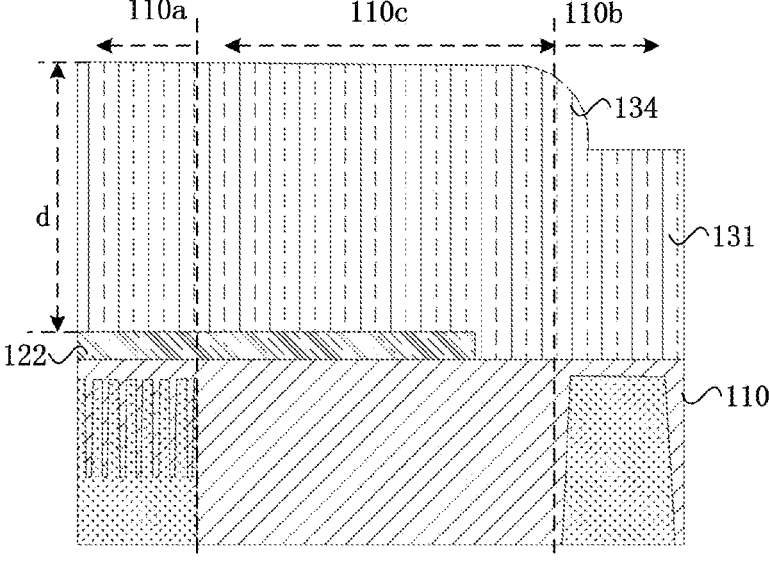
FIG. 6 is a schematic structural diagram of forming a first initial conductive layer according to an embodiment of the present disclosure.

As shown in FIG. 6, the first initial conductive layer 131 is formed on the first isolation layer 122 and the exposed substrate 110, and the first initial conductive layer 131 is located in the array region 110a, the boundary region 110c and the core region 110b. There are steps between the substrate 110 covered with the first isolation layer 122 and the substrate 110 not covered with the first isolation layer 122, such that there are steps on the first initial conductive layer 131, thereby forming a step portion 134 at the upper part of the first initial conductive layer 131. The step portion 134 may cause the steps to also exist in other functional layers subsequently formed on the first initial conductive layer 131, affecting the flatness of the other functional layers, and affecting the structure and performance of the semiconductor structure 100.

For example, the material of the first initial conductive layer 131 may be polycrystalline silicon.

For example, a thickness d (in FIG. 6) of the first initial conductive layer 131 may range from 40 nm to 120 nm. For example, the thickness d of the first initial conductive layer 131 may be 40 nm, 60 nm, 80 nm, 100 nm, 120 nm, or any one of 40 nm to 120 nm. Thereby, the first initial conductive layer 131 can be prevented from being too thin; after the first initial conductive layer 131 is subsequently planarized, the remaining first initial conductive layer 131 can be prevented from being too thin; and the first initial conductive layer 131 can be prevented from being too thick, and too long subsequent planarization is avoided.

S500: planarize the first initial conductive layer to obtain a first intermediate conductive layer.

Figures 7, 8:
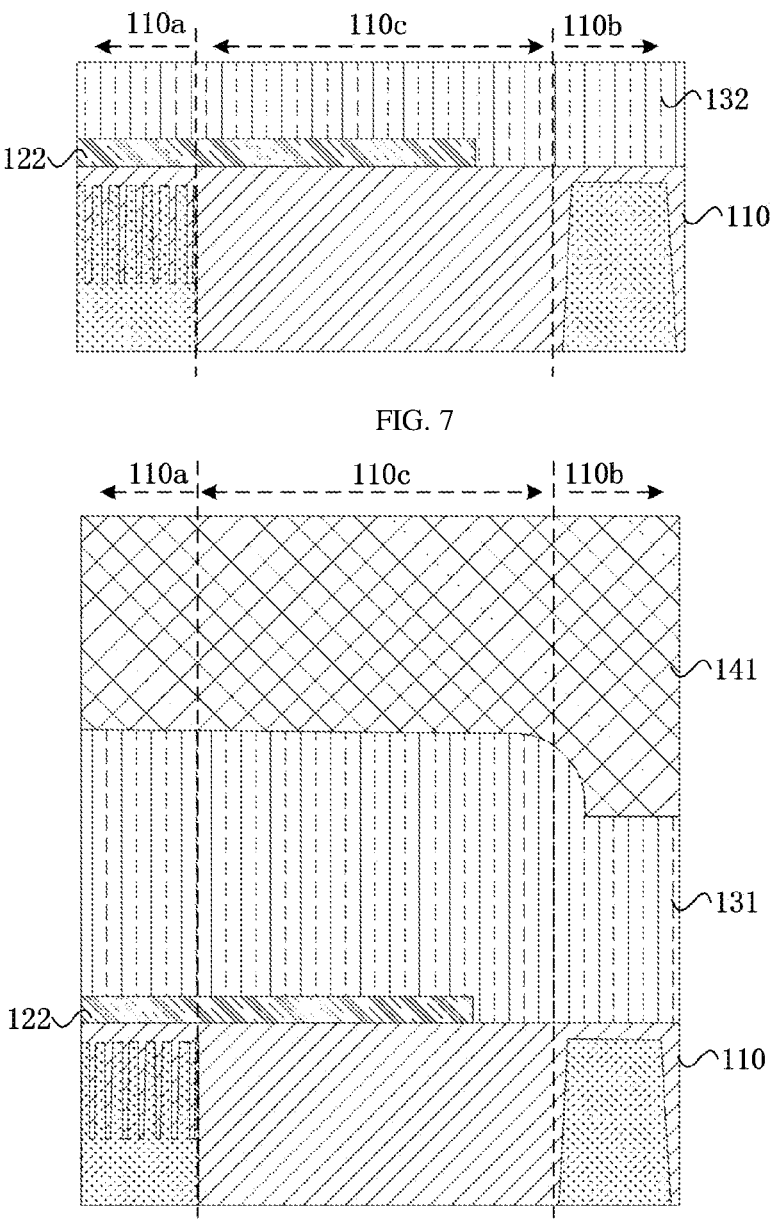
FIG. 7 is a schematic structural diagram of planarizing a first initial conductive layer according to an embodiment of the present disclosure.
FIG. 8 is a schematic structural diagram of forming a second initial mask layer according to an embodiment of the present disclosure.

As shown in FIG. 7, the first initial conductive layer 131 is planarized, to remove the first initial conductive layer 131 by a part of thickness and retain the first initial conductive layer 131 by a part of thickness, thereby obtaining the first intermediate conductive layer 132.

For example, S500 may include:

perform doping treatment on the first initial conductive layer 131 located in the array region 110a and the boundary region 110c.

The doping treatment is performed on the step portion 134 to change the properties of the first initial conductive layer 131 after the doping treatment, such that it is easier to remove the first initial conductive layer 131 after the doping treatment. The first initial conductive layer 131 after the doping treatment is removed fast, and the first initial conductive layer 131 not subjected to the doping treatment is removed slowly, such that the step portion 134 can be removed while the first initial conductive layer 131 is removed by a part of thickness, thereby forming the retained top surface of the first initial conductive layer 131 into a flat surface.

For example, the thickness of the first initial conductive layer 131 after the doping treatment may range from 5 nm to 10 nm. That is, the doping thickness of the step portion 134 may range from 5 nm to 10 nm. For example, the thickness of the step portion 134 after the doping treatment may be 5 nm, 6 nm, 7 nm, 8 nm, 9 nm, 10 nm, or any one of 5 nm to 10 nm. Therefore, the situation that the thickness of the step portion 134 after the doping treatment is too low to remove the step portion 134 well can be avoided, and the reduction of the doping accuracy due to too thick step portion 134 after the doping treatment can also be avoided.

For example, the doping material 135 for the doping treatment may include any one or more of group V elements such as arsenic atoms and phosphorus atoms, and group IV elements such as carbon atoms.

Perform etching treatment or chemical mechanical polishing treatment on the first initial conductive layer 131 to obtain the first intermediate conductive layer 132. The planarization may include methods such as dry etching treatment, wet etching treatment, or chemical mechanical polishing treatment. The first initial conductive layer 131 is removed by a part of thickness by means of planarization, and the remaining first initial conductive layer 131 is formed into the first intermediate conductive layer 132. The top surface of the first intermediate conductive layer 132 may be a plane having good flatness, thereby avoiding or reducing the influence on the flatness of other functional layers subsequently formed on the first intermediate conductive layer 132, and avoiding or reducing the influence on the structure and performance of the semiconductor structure 100.

For example, as shown in FIG. 8 to FIG. 12, the step of performing doping treatment on the first initial conductive layer 131 located in the array region 110a and the boundary region 110c may include:

As shown in FIG. 8, form an initial mask layer, where the initial mask layer is located in the array region 110a, the boundary region 110c and the core region 110b, and the initial mask layer covers the first initial conductive layer 131. Form an initial mask layer on the first initial conductive layer 131, where the initial mask layer may be a second initial mask layer 141 located in the array region 110a, the boundary region 110c and the core region 110b. For example, the second initial mask layer 141 may be photoresist.

Figures 9, 10:
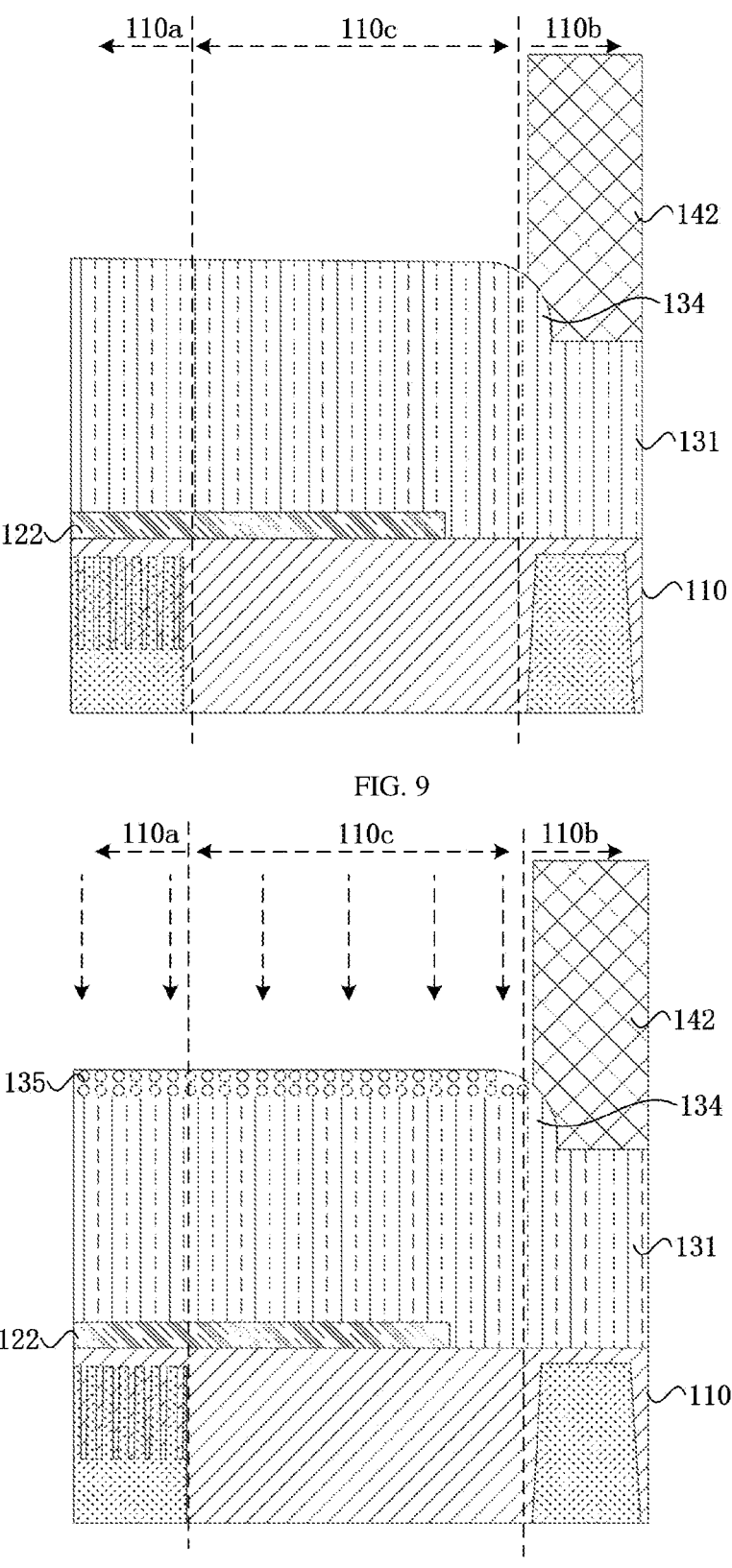
FIG. 9 is a schematic structural diagram of forming a second mask layer according to an embodiment of the present disclosure.
FIG. 10 is a schematic structural diagram of performing ion implantation according to an embodiment of the present disclosure.

As shown in FIG. 9, remove the second initial mask layer 141 located in the array region 110a and the boundary region 110c to obtain a mask layer, where the mask layer may be a second mask layer 142. That is, the second initial mask layer 141 above the step portion 134 may be removed to expose the step portion 134, thereby conveniently performing the doping treatment on the step portion 134.

It should be noted that as shown in FIG. 9, the side wall surface of the step portion 134 close to the core region 110b may be an arc surface. That is, the height of the side wall surface of the step portion 134 gradually increases, and the side wall surface is aslant arranged. At this time, the second mask layer 142 may cover part of the side wall surface of the step portion 134 close to the core region 110b, thereby avoiding the doping treatment for part of the side wall surface of the step portion 134 close to the core region 110b, avoiding a large distribution thickness of the doping material 135 along the side wall, avoiding incapability of accurately controlling the thickness of the doping treatment, or even avoiding the influence on the uniformity of doping treatment and the accuracy of thickness control due to the fact that the doping material 135 enters the lower side of the step portion 134 through a low side wall surface.

As shown in FIG. 10, perform ion implantation on the first initial conductive layer 131 located in the array region 110a and the boundary region 110c. The mode of doping treatment may include ion implantation.

For example, a dose of the ion implantation ranges from $10^{13}$ atom/cm$^2$ to $10^{15}$ atom/cm$^2$. For example, the dose of the ion implantation is $10^{13}$ atom/cm$^2$, $10^{14}$ atom/cm$^2$, $10^{15}$ atom/cm$^2$, or any one of $10^{13}$ atom/cm$^2$ to $10^{15}$ atom/cm$^2$. Therefore, too small dose of the ion implantation can be avoided, and too low content of the doping material 135 mixed in the first initial conductive layer 131 can be avoided, such that the improvement effect on the properties of the first initial conductive layer 131 is good. Moreover, too large dose of the ion implantation can be avoided, and it is beneficial to control the content of the doping material 135 mixed in the first initial conductive layer 131.

For example, the energy of the ion implantation may range from 30 keV to 100 keV. For example, the energy of the ion implantation may be 30 keV, 50 keV, 70 keV, 90 keV, 100 keV, or any one of 30 keV to 100 keV. Therefore, too low energy of the ion implantation can be avoided, and too low content or too shallow implantation of the doping material 135 mixed in the first initial conductive layer 131 can be avoided, such that the improvement effect on the properties of the first initial conductive layer 131 is good. Moreover, too high energy of the ion implantation can be avoided, such that too deep implantation of the doping material 135 is avoided, and the thickness (i.e., depth) of the doping treatment can be better controlled.

Figures 11, 12:
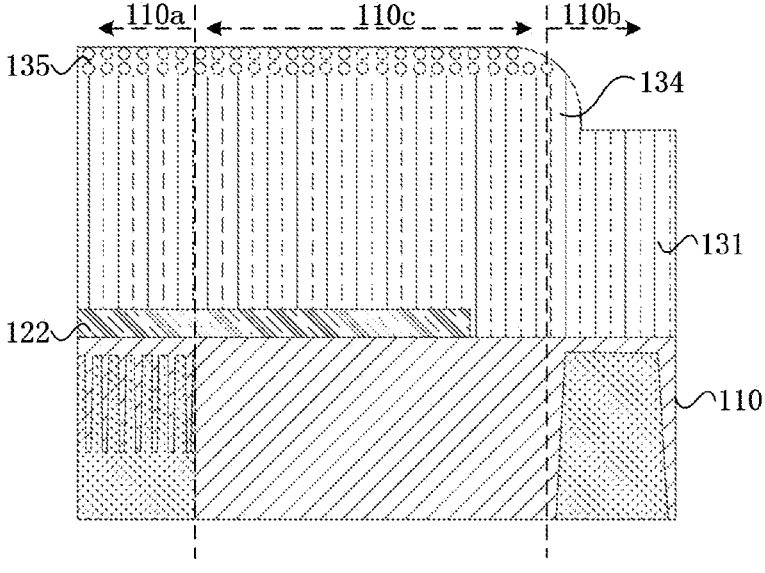
FIG. 11 is a schematic structural diagram of removing a second mask layer according to an embodiment of the present disclosure.
FIG. 12 is a schematic structural diagram of performing thermal annealing treatment on a first initial conductive layer according to an embodiment of the present disclosure.

As shown in FIG. 11, remove the second mask layer 142. After the doping treatment, the second mask layer 142 can be removed to expose the first initial conductive layer 131 located in the core region 110b.

After performing doping treatment on the first initial conductive layer 131 located in the array region 110a and the boundary region 110c, and before performing etching treatment or chemical mechanical polishing treatment on the first initial conductive layer 131 to obtain the first intermediate conductive layer 132, the manufacturing method may further include: perform thermal annealing treatment on the first initial conductive layer 131. As shown in FIG. 12, after the second mask layer 142 is removed, the first initial conductive layer 131 after the doping treatment can be subjected to the thermal annealing treatment. The surface crystal damage of the first initial conductive layer 131 caused by the ion implantation can be repaired through the thermal annealing treatment. The doping material 135 for the ion implantation is activated. Meanwhile, the doping material 135 is evenly distributed in the first initial conductive layer 131 having a required thickness.

S600: remove the first intermediate conductive layer located in the array region and a second-part boundary region adjacent to the array region, to obtain a first conductive layer.

Figure 13:
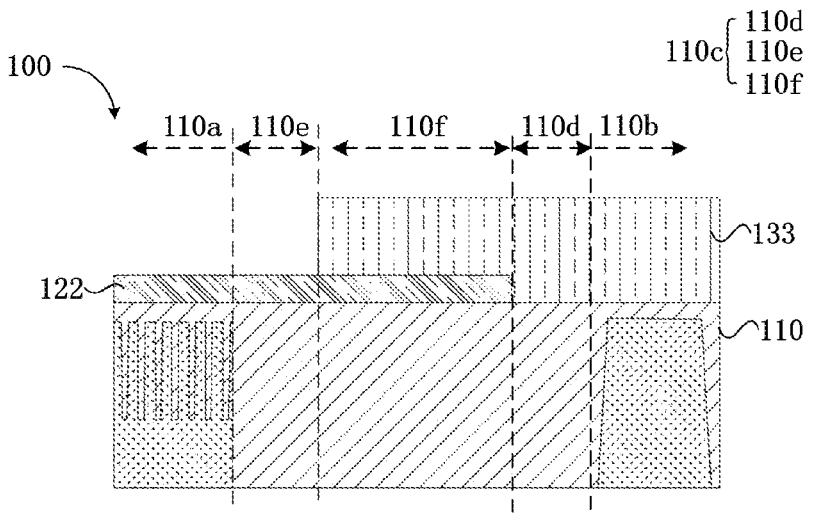
FIG. 13 is a schematic structural diagram of forming a first conductive layer according to an embodiment of the present disclosure.

As shown in FIG. 13, the first intermediate conductive layer 132 located in the array region 110a and the second-part boundary region 110e is removed, and the first intermediate conductive layer 132 located in the first-part boundary region 110d, the third-part boundary region 110f and the core region 110b is retained, to form the first conductive layer 133. The first conductive layer 133 covers the first-part boundary region 110d, the third-part boundary region 110f and the core region 110b.

As shown in FIG. 13, the orthographic projection of the first conductive layer 133 on the substrate 110 partially overlaps with the orthographic projection of the first isolation layer 122 on the substrate 110, and the overlap part between the orthographic projection of the first conductive layer 133 on the substrate 110 and the orthographic projection of the first isolation layer 122 on the substrate 110 is located in the third-part boundary region 110f. The first conductive layer 133 and the first isolation layer 122 of the overlap part can avoid exposure of the substrate 110 and protect the substrate 110.

Figure 14:
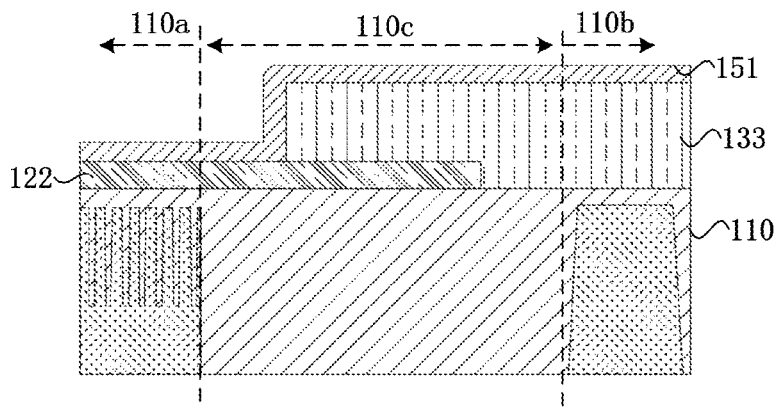
FIG. 14 is a schematic structural diagram of forming a second conductive layer according to an embodiment of the present disclosure.

After the step of obtaining the first conductive layer 133, the manufacturing method may further include:

As shown in FIG. 14, form a second conductive layer 151, where the second conductive layer 151 is located in the array region 110a, the boundary region 110c and the core region 110b, and the second conductive layer 151 covers the first isolation layer 122 and the first conductive layer 133. That is, the second conductive layer 151 is formed on the first isolation layer 122 and the first conductive layer 133, and the second conductive layer 151 covers the array region 110a, the boundary region 110c and the core region 110b.

Figure 15:
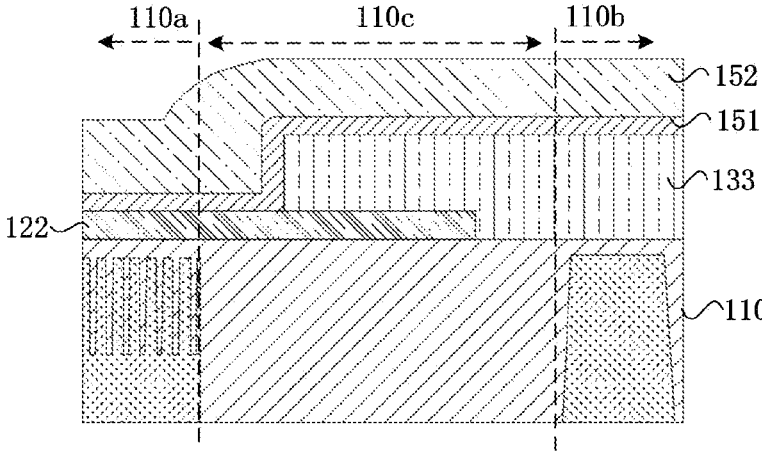
FIG. 15 is a schematic structural diagram of forming a third conductive layer according to an embodiment of the present disclosure.

After the step of forming the second conductive layer 151, the manufacturing method may further include:

As shown in FIG. 15, form a third conductive layer 152, where the third conductive layer 152 is located in the array region 110a, the boundary region 110c and the core region 110b, and the third conductive layer 152 covers the second conductive layer 151. That is, the third conductive layer 152 is formed on the second conductive layer 151, and the third conductive layer 152 covers the array region 110a, the boundary region 110c and the core region 110b.

For example, the material of the second conductive layer 151 may be titanium nitride, and the material of the third conductive layer 152 may be tungsten. The titanium nitride can prevent the tungsten from diffusing to react with silicon to form low-resistance ohmic contact, which is beneficial to improve the adhesion of the tungsten. In addition, the tungsten has a good step coverage rate.

Figure 16:
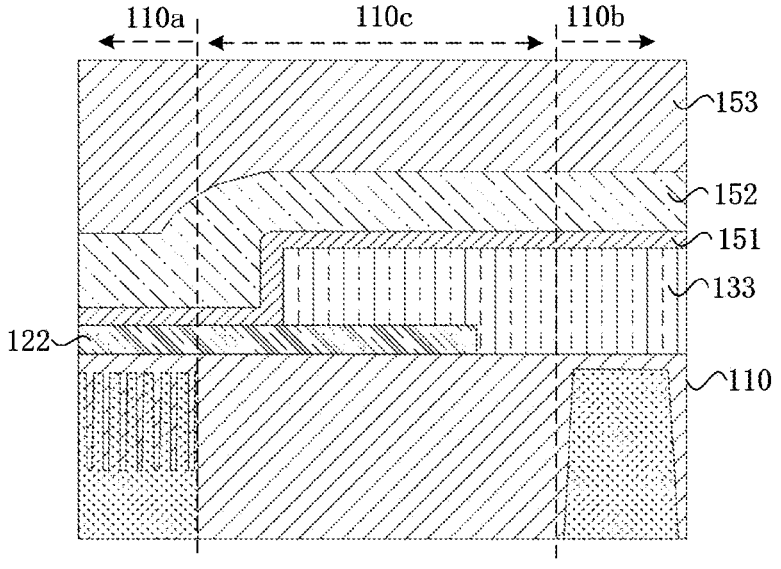
FIG. 16 is a schematic structural diagram of forming a second isolation layer according to an embodiment of the present disclosure.

After the step of forming the third conductive layer 152, the manufacturing method may further include:

As shown in FIG. 16, form a second isolation layer 153, where the second isolation layer 153 is located in the array region 110a, the boundary region 110c and the core region 110b, and the second isolation layer 153 covers the third conductive layer 152. That is, the second isolation layer 153 is formed on the third conductive layer 152, and the second isolation layer 153 covers the array region 110a, the boundary region 110c and the core region 110b.

For example, the material of the second isolation layer 153 may be silicon nitride.

It should be noted that any one or more of the second conductive layer 151, the third conductive layer 152 and the second isolation layer 153 may be formed into the functional layers according to the above embodiment.

The second conductive layer 151 and the third conductive layer 152 located in the array region 110a may be subsequently formed into bit lines.

The thin oxide layer located in the core region 110b, the first conductive layer 133, the second conductive layer 151, the third conductive layer 152, and the active region 111 in the substrate 110 may be subsequently formed into devices, such as transistors.

Figure 17:
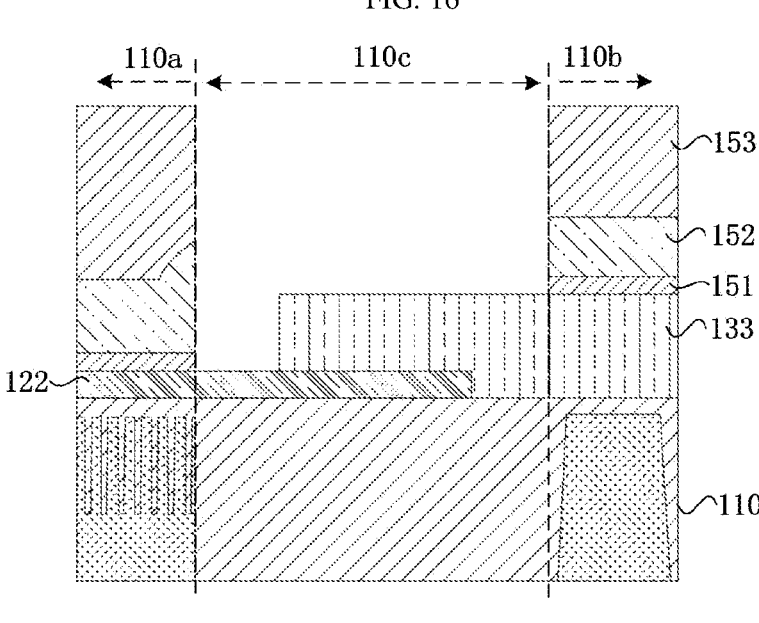
FIG. 17 is a schematic structural diagram of removing a second conductive layer, a third conductive layer and a second isolation layer which are in a boundary region according to an embodiment of the present disclosure.

After the step of forming the second isolation layer 153, the manufacturing method may further include:

As shown in FIG. 17, sequentially remove the second isolation layer 153, the third conductive layer 152 and the second conductive layer 151 which are located in the boundary region 110c, electrically isolate the second conductive layer 151 located in the core region 110b from the second conductive layer 151 located in the array region 110a, and electrically isolate the third conductive layer 152 located in the core region 110b from the third conductive layer 152 located in the array region 110a.

When the second isolation layer 153, the third conductive layer 152 and the second conductive layer 151 which are located in the boundary region 110c are removed, because the top surface flatness of the first conductive layer 133 is good, the second isolation layer 153, the third conductive layer 152 and the second conductive layer 151 which are located above the first conductive layer 133 are more uniform in thickness, such that the residues of the second conductive layer 151 can be avoided or reduced, thereby avoiding or reducing the influence of the remaining second conductive layer 151 on the structure and performance of the semiconductor structure 100.

After the second conductive layer 151 in the boundary region 110c is removed, part or whole of the first conductive layer 133 in the boundary region 110c can be removed (FIG. 18), or, the first conductive layer 133 in the boundary region 110c can also be retained (FIG. 17).

For example, the boundary region 110c can also be filled with an insulating material to ensure necessary electrical isolation between the array region 110a and the core region 110b.

The embodiments of the present disclosure further provide a semiconductor structure 100. The semiconductor structure 100 may be manufactured by the manufacturing method of a semiconductor structure 100 according to the above embodiment.

As shown in FIG. 13, the semiconductor structure 100 may include a substrate 110. The substrate 110 includes an array region 110a, a core region 110b, and a boundary region 110c located between the array region 110a and the core region 110b. The first isolation layer 122 and the first conductive layer 133 are sequentially stacked on the substrate 110. The first isolation layer 122 covers the substrate 110 in the array region 110a, the second-part boundary region 110e and the third-part boundary region 110f. The first conductive layer 133 covers the first isolation layer 122 and the substrate 110 in the core region 110b, the first-part boundary region 110d and the third-part boundary region 110f. The top surface of the first conductive layer 133 may be a plane, thereby achieving good flatness. For example, the first conductive layer 133 may be planarized, thereby forming the top surface of the first conductive layer 133 into a flat surface, avoiding the influence on the flatness of other functional layers (such as the second conductive layer 151, the third conductive layer 152, the second isolation layer 153, etc.) subsequently formed on the first conductive layer 133, avoiding or reducing the remaining of the functional layers in the boundary region 110c in the following etching process, and avoiding or reducing the influence on the structure and performance of the semiconductor structure 100.

The orthographic projection of the first conductive layer 133 on the substrate 110 partially overlaps with the orthographic projection of the first isolation layer 122 on the substrate 110, and the overlap part between the orthographic projection of the first conductive layer 133 on the substrate 110 and the orthographic projection of the first isolation layer 122 on the substrate 110 is located in the third-part boundary region 110f, thereby avoiding exposure of the substrate 110 and protecting the substrate 110.

Figure 18:
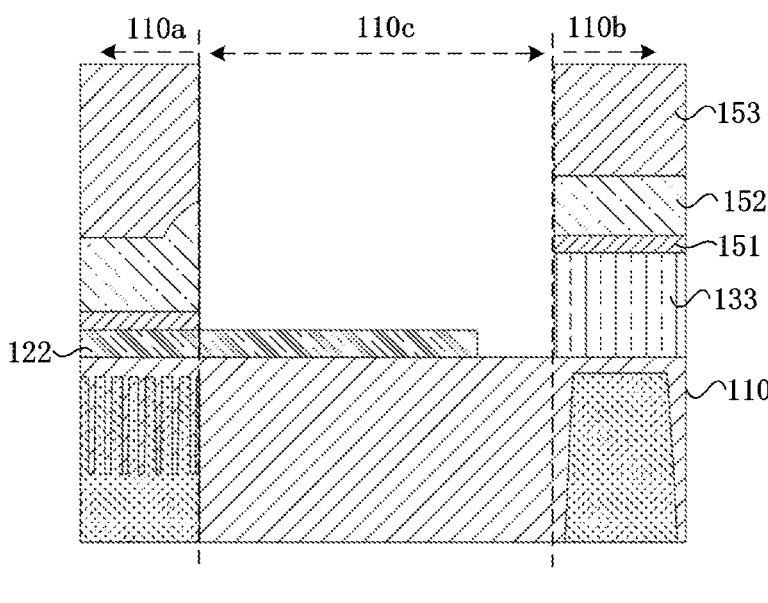
FIG. 18 is a schematic structural diagram of removing a first conductive layer in a boundary region according to an embodiment of the present disclosure.

It should be noted that in some examples, in the following process, the first conductive layer 133 in the boundary region 110c can be retained (FIG. 17), or a part or whole of the first conductive layer 133 in the boundary region 110c can be removed (FIG. 18). The semiconductor structure 100 may be a semiconductor structure 100 formed by retaining at least part of the first conductive layer 133 in the boundary region 110c, or may be a semiconductor structure 100 formed by removing the first conductive layer 133 in the boundary region 110c.

The embodiments of the present disclosure further provide a memory. The memory may include the semiconductor structure 100 manufactured by the manufacturing method of a semiconductor structure 100 according to the above embodiment.

For example, the memory may include, for example, a DRAM, a static random access memory (SRAM), a flash memory, an electrically erasable programmable read-only memory (EEPROM), a phase change random access memory (PCRAM), or a magnetoresistive random access memory (MRAM).

For example, the semiconductor structure 100 according to the above embodiment can be applied to a non-memory device. The non-memory device may be a logic device (such as a microprocessor, a digital signal processor, or a microcontroller), or a similar device.

In the embodiments of the present disclosure, the DRAM is taken as an example for description.

The semiconductor structure 100 according to the above embodiment can be applied to a memory. The memory includes a semiconductor structure 100. The semiconductor structure 100 may include a substrate 110. The substrate 110 includes an array region 110*a*, a core region 110*b*, and a boundary region 110*c* located between the array region 110*a* and the core region 110*b*. The first isolation layer 122 and the first conductive layer 133 are sequentially stacked on the substrate 110. The first isolation layer 122 covers the substrate 110 in the array region 110*a*, the second-part boundary region 110*e* and the third-part boundary region 110*f*. The first conductive layer 133 covers the first isolation layer 122 and the substrate 110 in the core region 110*b*, the first-part boundary region 110*d* and the third-part boundary region 110*f*. The top surface of the first conductive layer 133 may be a plane, thereby achieving good flatness. For example, the first conductive layer 133 may be planarized, thereby forming the top surface of the first conductive layer 133 into a flat surface, avoiding the influence on the flatness of other functional layers (such as the second conductive layer 151, the third conductive layer 152, the second isolation layer 153, etc.) subsequently formed on the first conductive layer 133, avoiding or reducing the remaining of the functional layers in the boundary region 110*c* in the following etching process, and avoiding or reducing the influence on the structure and performance of the memory.

The orthographic projection of the first conductive layer 133 on the substrate 110 partially overlaps with the orthographic projection of the first isolation layer 122 on the substrate 110, and the overlap part between the orthographic projection of the first conductive layer 133 on the substrate 110 and the orthographic projection of the first isolation layer 122 on the substrate 110 is located in the third-part boundary region 110*f*, thereby avoiding exposure of the substrate 110 and protecting the substrate 110.

It should be noted that in some examples, in the following process, the first conductive layer 133 in the boundary region 110*c* can be removed, to electrically isolate the first conductive layer 133 located in the core region 110*b* from the first conductive layer 133 located in the array region 110*a*. In some other examples, a part or whole of the first conductive layer 133 in the boundary region 110*c* can also be retained.

It should be noted herein that the numerical values and numerical ranges involved in the embodiments of the present disclosure are approximate values, and there may be a certain range of errors due to the influence of the manufacturing process, and those skilled in the art may consider these errors to be negligible.

Finally, it should be noted that the foregoing embodiments are merely used to explain the technical solutions of the present application, but are not intended to limit the present application. Although the present application is described in detail with reference to the foregoing embodiments, the person of ordinary skill in the art should understand that they can still modify the technical solutions described in the foregoing embodiments, or make equivalent substitutions on some or all technical features therein. These modifications or substitutions do not make the essence of the corresponding technical solutions deviate from the spirit and scope of the technical solutions of the embodiments of the present application.

The invention claimed is:

1. A manufacturing method of a semiconductor structure, comprising:
providing a substrate, wherein the substrate comprises an array region, a core region, and a boundary region located between the array region and the core region;
forming a first initial isolation layer, wherein the first initial isolation layer is located in the array region, the core region and the boundary region, and the first initial isolation layer covers the substrate;
removing the first initial isolation layer located in the core region and a first-part boundary region adjacent to the core region, to obtain a first isolation layer;
forming a first initial conductive layer, wherein the first initial conductive layer is located in the array region, the core region and the boundary region, and the first initial conductive layer covers the substrate and the first isolation layer;
planarizing the first initial conductive layer to obtain a first intermediate conductive layer; and
removing the first intermediate conductive layer located in the array region and a second-part boundary region adjacent to the array region, to obtain a first conductive layer, wherein
an orthographic projection of the first conductive layer on the substrate partially overlaps with an orthographic projection of the first isolation layer on the substrate, and an overlap part between the orthographic projection of the first conductive layer on the substrate and the orthographic projection of the first isolation layer on the substrate is located in the boundary region.

2. The manufacturing method of a semiconductor structure according to claim 1, wherein the planarizing the first initial conductive layer to obtain a first intermediate conductive layer comprises:
performing doping treatment on the first initial conductive layer located in the array region and the boundary region; and
performing etching treatment or chemical mechanical polishing treatment on the first initial conductive layer to obtain the first intermediate conductive layer.

3. The manufacturing method of a semiconductor structure according to claim 2, wherein the performing doping treatment on the first initial conductive layer located in the array region and the boundary region comprises:
forming an initial mask layer, wherein the initial mask layer is located in the array region, the boundary region and the core region, and the initial mask layer covers the first initial conductive layer;
removing the initial mask layer located in the array region and the boundary region to obtain a mask layer;
performing ion implantation on the first initial conductive layer located in the array region and the boundary region; and
removing the mask layer.

4. The manufacturing method of a semiconductor structure according to claim 2, after performing doping treatment on the first initial conductive layer located in the array region and the boundary region, and before performing etching treatment or chemical mechanical polishing treatment on the first initial conductive layer to obtain the first intermediate conductive layer, further comprising: performing thermal annealing treatment on the first initial conductive layer.

5. The manufacturing method of a semiconductor structure according to claim 1, wherein a thickness of the first initial conductive layer ranges from 40 nm to 120 nm.

6. The manufacturing method of a semiconductor structure according to claim 1, wherein a material of the first initial conductive layer is polycrystalline silicon.

7. The manufacturing method of a semiconductor structure according to claim 2, wherein a thickness of the first initial conductive layer after the doping treatment ranges from 5 nm to 10 nm.

8. The manufacturing method of a semiconductor structure according to claim 3, wherein a dose of the ion implantation ranges from $10^{13}$ atom/cm$^2$ to $10^{15}$ atom/cm$^2$, and an energy of the ion implantation ranges from 30 keV to 100 keV.

9. The manufacturing method of a semiconductor structure according to claim 2, wherein a doping material for the doping treatment comprises arsenic atoms, phosphorus atoms or carbon atoms.

10. The manufacturing method of a semiconductor structure according to claim 1, wherein the boundary region comprises the first-part boundary region, the second-part boundary region, and a third-part boundary region located between the first-part boundary region and the second-part boundary region, and the overlap part between the orthographic projection of the first conductive layer on the substrate and the orthographic projection of the first isolation layer on the substrate is located in the third-part boundary region.

11. The manufacturing method of a semiconductor structure according to claim 1, after obtaining the first conductive layer, further comprising:

forming a second conductive layer, wherein the second conductive layer is located in the array region, the boundary region and the core region, and the second conductive layer covers the first isolation layer and the first conductive layer.

12. The manufacturing method of a semiconductor structure according to claim 11, wherein a material of the second conductive layer is titanium nitride.

13. The manufacturing method of a semiconductor structure according to claim 11, after forming the second conductive layer, further comprising:

forming a third conductive layer, wherein the third conductive layer is located in the array region, the boundary region and the core region, and the third conductive layer covers the second conductive layer.

14. The manufacturing method of a semiconductor structure according to claim 13, wherein a material of the third conductive layer is tungsten.

15. The manufacturing method of a semiconductor structure according to claim 13, after forming the third conductive layer, further comprising:

forming a second isolation layer, wherein the second isolation layer is located in the array region, the boundary region and the core region, and the second isolation layer covers the third conductive layer.

16. The manufacturing method of a semiconductor structure according to claim 15, wherein a material of at least one of the first isolation layer or the second isolation layer is silicon nitride.

17. The manufacturing method of a semiconductor structure according to claim 15, after forming the second isolation layer, further comprising:

sequentially removing the second isolation layer, the third conductive layer and the second conductive layer which are located in the boundary region, electrically isolating the second conductive layer located in the core region from the second conductive layer located in the array region, and electrically isolating the third conductive layer located in the core region from the third conductive layer located in the array region.

* * * * *